United States Patent [19]

Ogawa et al.

[11] Patent Number: 4,632,849
[45] Date of Patent: Dec. 30, 1986

[54] METHOD FOR MAKING A FINE POWDER OF A METAL COMPOUND HAVING CERAMIC COATINGS THEREON

[75] Inventors: Masahiro Ogawa, Toyoake; Susumu Abe, Toyota, both of Japan

[73] Assignee: Toyota Jidosha Kabushiki Kaisha, Toyota, Japan

[21] Appl. No.: 692,423

[22] Filed: Jan. 18, 1985

[30] Foreign Application Priority Data

Jan. 19, 1984 [JP] Japan .................................. 59-07966

[51] Int. Cl.$^4$ .............................................. B05D 7/00
[52] U.S. Cl. ................................. 427/215; 427/248.1; 427/250; 427/253; 427/255; 427/255.1; 427/343
[58] Field of Search ....................... 427/255, 250, 255.1, 427/248.1, 255.2, 255.3, 215, 343, 253; 423/263, 344, 346, 412, 440; 501/88, 87, 96, 97, 152

[56] References Cited

U.S. PATENT DOCUMENTS

| | | | |
|---|---|---|---|
| 3,552,995 | 1/1971 | Powell | 427/215 |
| 3,723,601 | 3/1973 | Svanstrom | 423/440 |
| 4,399,115 | 8/1983 | Satu et al. | 501/97 |

FOREIGN PATENT DOCUMENTS 53-118409 10/1978 Japan .................................. 423/344

Primary Examiner—Sadie L. Childs
Attorney, Agent, or Firm—Oblon, Fisher, Spivak, McClelland, & Maier

[57] ABSTRACT

A method for making fine powder of a metallic compound coated with ceramics is described. In the method, a gaseous mixture of at least one metal vapor constituting one component of a metallic compound and a carrier gas for the at least one metal vapor is passed at a speed of 50 to 2000 m/second into another element constituting the other element of the metallic compound or in an atmosphere of a gas containing the other element, which is heated to a temperature of not larger than 0.8 time as low as a melting point of the at least one metal so that the metal vapor and another element are reacted with each other while rapidly cooling, thereby obtaining a fine powder of a metallic compound. The metallic compound fine powder is further passed into other metal vapor or other metallic compound vapor to cover the metallic compound fine powder with the film of the other metal or metallic compound.

10 Claims, 4 Drawing Figures

4,632,849

METHOD FOR MAKING A FINE POWDER OF A METAL COMPOUND HAVING CERAMIC COATINGS THEREON

BACKGROUND OF THE INVENTION

1. Field of the Invention

This invention relates to a method of making a fine powder of a metallic compound having ceramic coatings thereon. The fine powder of a metallic compound obtained by the method of the invention is suitably used as a sintering material.

2. Description of the Prior Art

As is well known in the art, sintering of a metallic compound powder such as silicon nitride powder does not smoothly proceed when using the metallic compound powder alone. It is the usual practice to add, to metallic compound powder, sintering aids such as yttrium oxide, aluminium oxide and the like.

In order to cause the sintering to proceed smoothly, it is preferred that a metallic compound powder and a sintering aid are uniformly mixed to make a larger contact area thereof.

However, since the metallic compound powder and the sintering aid are both in the form of powders, it is difficult to mix the powders substantially uniformly, with an attendant problem that the strength of the sintered product may not be satisfactory depending on the degree of uniformity in the mixing.

Further, the metallic compound powder is too large to obtain the strong sintered product.

SUMMARY OF THE INVENTION

It is an object of the invention to provide a method for making fine powder of a metallic compound coated with ceramics which overcomes the problems of the prior art.

It is another object of the invention to provide a method for making fine powder of a metallic compound with a ceramic coating, which has a very fine particle size and on which ceramics is uniformly coated on individual particles of the metallic compound fine powder.

It is a further object of the invention to provide a method for making fine powder of a metallic compound coated with ceramics, which can be produced in a high preparatory efficiency.

The above objects can be accomplished, according to the present invention, by a method for making fine powder of a metallic compound coated with ceramics, which method comprises the steps of providing a gaseous mixture of at least one metal vapor constituting one component of a metallic compound and a carrier gas for the at least one metal vapor, passing the gaseous mixture at a speed of 50 to 2000 m/second into another element constituting the other element of the metallic compound or in an atmosphere of a gas containing the other element heated to a temperature of not larger than 0.8 time as low as a melting point of the at least one metal so that the metal vapor and another element are reacted with each other while rapidly cooling, thereby obtaining a fine powder of a metallic compound, and passing the metallic compound fine powder through other metal vapor or other metallic compound vapor to cover the metallic compound fine powder with the other metal or metallic compound.

DETAILED DESCRIPTION OF THE INVENTION

Figure 1:
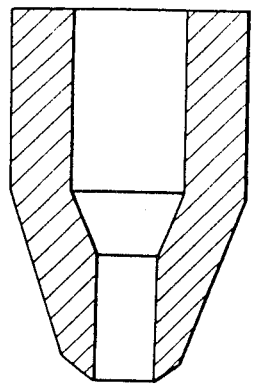
FIG. 1 is a sectional view of a fine nozzle used in the method of the invention.

The metal and another element which constitute a metallic compound produced in accordance with the method of the invention should be a combination of an arbitrary metal and an element which are chemically combined together. In particular, preferable metals include silicon, aluminium, titanium, zirconium and mixtures thereof.

Another element includes nitrogen, carbon, oxygen and another metallic element (in which case the resulting metallic compound is a metal-metal compound). In this connection, another element which constitutes a part of the gaseous mixture may be not only a gas of the element itself, but also an element produced from a compound containing the element and capable of releasing the element. For instance, when another element is nitrogen, there can be used not only nitrogen gas, but also compounds such as ammonia. If another element is carbon, there may be used lower aliphatic hydrocarbons such as methane, ethane, propane and the like.

Other metals or metallic compounds which are coated on the surface of the metallic compound fine powder are expected to serve as sintering aids and include, for example, yttrium, aluminium, magnesium, yttrium chloride, aluminium chloride and the like.

In the practice of the invention, a carrier gas is used to smoothly carry the metal vapor and to control the pressure within a furnace at a predetermined level. The carrier gas includes an inert gas such as argon or the like. Abovementioned another gaseous element or a gas containing said another element therein may be also used as the carrier gas. It will be noted that if said another element or a gas containing said another element therein is used, such an element reacts with some metals, so that the rate of synthesis can be increased.

Into a chamber in which the metallic compound fine powder is coated with other metal or metallic compound, inert gases such as argon should preferably be charged in order to keep the temperature and pressure at predetermined levels.

The gaseous mixture comprising a metal vapor and a carrier gas prior to rapid cooling should preferably have a temperature of not lower than 2000° C. and a pressure of not larger than $10^{-1}$ atmospheric pressure when fine powder of silicon nitride is made. This is because the temperature and pressure should be so controlled that the metal is stably present as a vapor.

The gaseous mixture is blown out into another element, as a gas, constituting an intended metallic compound or an atmosphere of a gas containing another element, thereby causing the metal and another element to react while rapidly cooling. In the practice of the invention, the rapid cooling of the gaseous mixture should be effected in a gas of another element or a gas containing another element. The shape of a nozzle from which the gaseous mixture is blown out greatly contributes to the degree of rapid cooling. More particularly, if a nozzle used is a divergent nozzle, the effect of the rapid cooling is great.

In order to effect the rapid cooling in another element or in a gas containing another element, it is necessary that the temperature of the other element or the gas comprising the other element should be lower than a temperature of the gaseous mixture. In this case, the temperature (°C.) is preferably below 0.8 time as low as the melting point (°C.) of the metal constituting an intended metallic compound.

For the reaction between the metal and the other element under rapid cooling conditions, the gaseous mixture should be blown out into the other element or an atmosphere of a gas containing the other element at a preferable speed of 50 to 2000 m/second. If higher speeds are used, the reaction does not proceed satisfactorily. In order to attain an optimum rate of synthesis or an optimum yield, the blowing-out speed should preferably be in the range of 50 to 800 m/second.

Subsequently, the resulting metallic compound fine powder is coated with other metal or metallic compound. To this end, the metallic compound fine powder should be heated at a temperature of 800° to 1100° C. At lower temperatures, no coating layer is formed.

As will be seen from the foregoing description, the method of making a ceramic-coated metallic compound fine powder according to the invention is characterized in that at least one metal constituting an intended metallic compound is reacted with another element while blowing out into another gaseous element or a gas containing another element and the resulting metallic compound fine powder is deposited with a ceramic coating thereon.

Reference is now made to how the rapid cooling of the gaseous mixture is effective in providing a metallic compound fine powder with regard to the production of a silicon nitride fine powder from metallic silicon vapor and nitrogen gas.

Metallic silicon is a metal which is rather difficult to vaporize and has such a low equilibrium vapor pressure as 0.5 Torr. ($6.6 \times 10^{-4}$ atm.) even at a temperature of 2000° C. The method of making a fine powder of silicon nitride by the use of metallic silicon vapor obtained by heating metallic silicon at temperatures over 2000° C. is not better from the standpoint of thermal energy consumption than conventional methods. However, according to the method of the invention, metallic silicon can be quickly converted the vaporized state to the solid state when metallic silicon vapor is rapidly cooled, so that the method according to the invention can produce a metallic compound fine powder which has an extremely fine particle size of the order of 0.01 μm and also has substantially uniform particle size. In contrast, in known methods utilizing gas phase reactions, such a fine and uniform metallic compound powder cannot be obtained. Metallic silicon and nitrogen gas react with each other at a relatively low temperature of around 900° to 1700° C., thereby forming silicon nitride which is stable in the above temperature range. In this connection, however, if silicon nitride is prepared using a gas phase reaction between metallic silicon-generating gas (silicon gas ($SiH_4$)) and nitrogen-generating gas (ammonia gas ($NH_3$) at a temperature of 900° to 1700° C., the reaction readily advances in the direction where metallic silicon and nitrogen gas are chemically combined to give solid silicon nitride, with the result that within a very short time period, silicon nitride particles grow up to provide coarse particles.

Reference is then made to choice of a cooling means for rapidly cooling the gaseous mixture.

Figure 2:
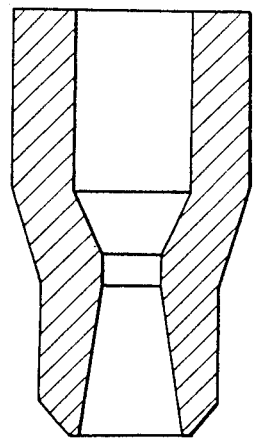
FIG. 2 is a sectional view of a Laval nozzle used in the method of the invention.

In the practice of the invention, the temperature of the other element or a gas containing the other element greatly contributes to the rapid cooling. The gaseous mixture is cooled by means of the other element or the gas containing the other element. In addition, the gaseous mixture is also rapidly cooled by blowing out through a nozzle, utilzing a pressure difference, into the other element or the gas containing the other element prior to contact of the gaseous mixture with the other element or the gas containing the other element. A great difference in cooling rate is produced between a case where a fine nozzle as shown in FIG. 1 is used and a case where a divergent nozzle (Laval nozzle) as shown in FIG. 2 is used. More specifically, when the fine nozzle is used, the blowing speed is from 50 to 880 m/second. Accordingly, the divergent nozzle has a greater effect with regard to rapid cooling, but if the cooling rate is too great in the method of the invention, the reaction between the metal and the other element or a gas containing the other element does not proceed satisfactorily. Where, for example, silicon nitride fine powder is made, the fine nozzle is more effective in rate of synthesis than the divergent nozzle.

The temperature and pressure conditions before or after the rapid cooling or adiabatic expansion of the gaseous mixture are described using production of silicon nitride fine powder.

The temperature and pressure conditions at which silicon nitride either breaks up or stays in the reacted state are determined by the second law of thermodynamics. In other words, the chemical reaction between metallic silicon vapor and nitrogen gas can be expressed in the following formula (1):

$$3(Si) + 2(N_2) = (Si_3N_4) \tag{1}$$

The change of free energy ΔF in the above reaction (1) may be expressed by the following formula (2) or (3):

$$\Delta F = \Delta F_o + RT \mathrm{Ln}\{1/(P_{Si})^{-3} \cdot (P_{N2})^{-2}\} \tag{2}$$

in which,
ΔFo: reference free energy change
R: gas constant
T: temperature (°K.)
$P_{Si}$: partial pressure of metallic silicon vapor
$P_{N2}$: partial pressure of nitrogen.

$$\Delta F = -495853 - 7.755T\log T = 205.22T - 4.575T \times (3 \log P_{Si} + 2 \log P_{N2}) \tag{3}$$

In this formula (3), silicon nitride is stable as a solid when ΔF is negative, while metallic silicon vapor and nitrogen gas are stable as gases when ΔF is positive.

Figure 3:
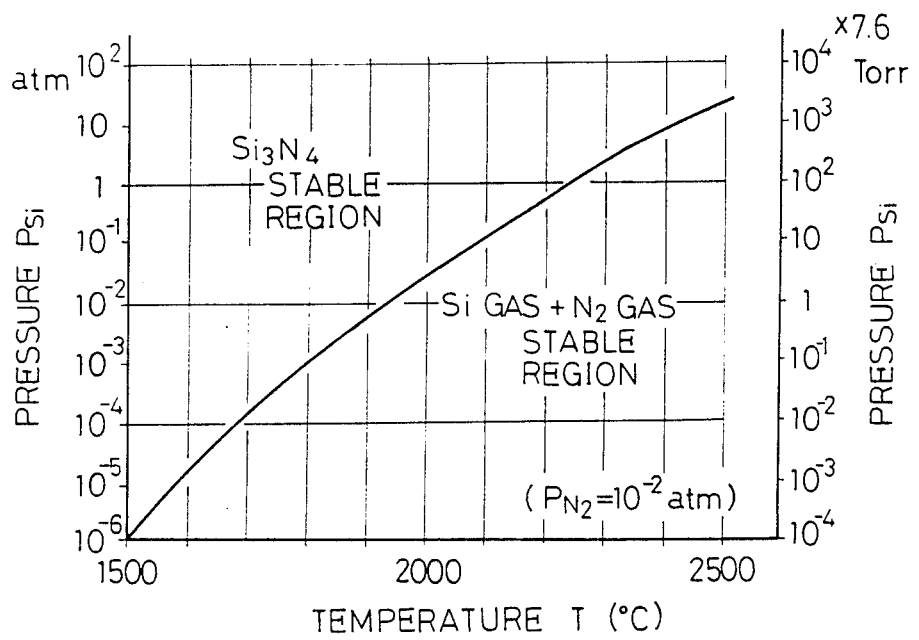
FIG. 3 is a reaction state diagram showing a region where silicon nitride is stable and a region where metallic silicon vapor and nitrogen gas are stable as gases in case where the partial pressure of nitrogen gas is $10^{-2}$ atmospheric pressure.

In FIG. 3, there is shown a reaction state diagram indicating a region in which silicon nitride is stable and a region in which metallic silicon vapor and nitrogen gas are stable as gases when the partial pressure of nitrogen gas ($P_{N2}$) is $10^{-2}$ atmospheres (7.6 Torr). From FIG. 3, it can be seen that metallic silicon vapor and nitrogen gas are more stable than solid silicon nitride at a pressure of around $10^{-2}$ atmospheres when the temperature is greater than about 2000° C.

Therefore, in the method of making fine powder according to the invention, it will be clear that it is preferable to mix the metallic vapor and the carrier gas in the region where the metallic vapor is stable, to rapidly cool the mixture gas by blowing out the mixture into the other element in the gaseous state or a gas containing the other element of lower temperatures in which the reaction is carried out, and to continue the cooling without promoting further growth of particles.

In the practice of the invention, a gaseous mixture of the metal and the carrier gas is blown out into the other element or a gas containing the other element at a predetermined speed through a nozzle, by which the metal and the other element are cooled to a temperature range, where they are reacted, by adiabatic expansion caused by the passage through the nozzle and direct contact of the mixture with the other element or the gas containing the other element. Thereafter, the reaction system can be rapidly cooled to a region in which the metal compound is kept stable.

The resulting metallic compound fine powder is heated to a temperature at which it is not decomposed, after which the fine powder is passed into another metal vapor or another metallic compound vapor and rapidly cooled by passing it through a fine nozzle or Laval nozzle while being deposited with the metal or metallic compound on the surfaces thereof, followed by oxidation and stabilization on the surfaces thereof.

The present invention has the features and advantages summarized below.

(a) The metallic vapor constituting the gaseous mixture is rapidly cooled by the adiabatic expansion upon passage through a nozzle and direct contact with another element to give a fine solid powder having such a size as in the vaporized state. At the same time, the metallic vapor reacts with another element constituting the metallic compound. As a result, there can be obtained a ceramic-coated metallic compound fine powder which has a very fine and substantially uniform particle size.

(b) Vapors can be readily and continuously converted from the vaporized state to the solid state by passage through a nozzle and contact with another element or a gas containing the element, which leads to efficient and continuous production of a ceramic-coated metallic compound of high purity.

(c) When the gaseous mixture is passed into another element or a gas containing the element at an appropriate cooling rate, the rate of synthesis of the ceramic-coated metallic compound can be remarkably improved.

(d) The final ceramic-coated metallic compound fine powder has a ceramic film formed on the surfaces thereof, which prevents the inner metallic compound from deteriorating in nature and ensures easy handling.

(f) The final ceramic-coated metallic compound powder has a sintering aid uniformly deposited on the surface thereof, and thus the sintered product having good sintering ability and high strength is obtained.

Examples of the present invention are described with reference to the accompanying drawings.

Figure 4:
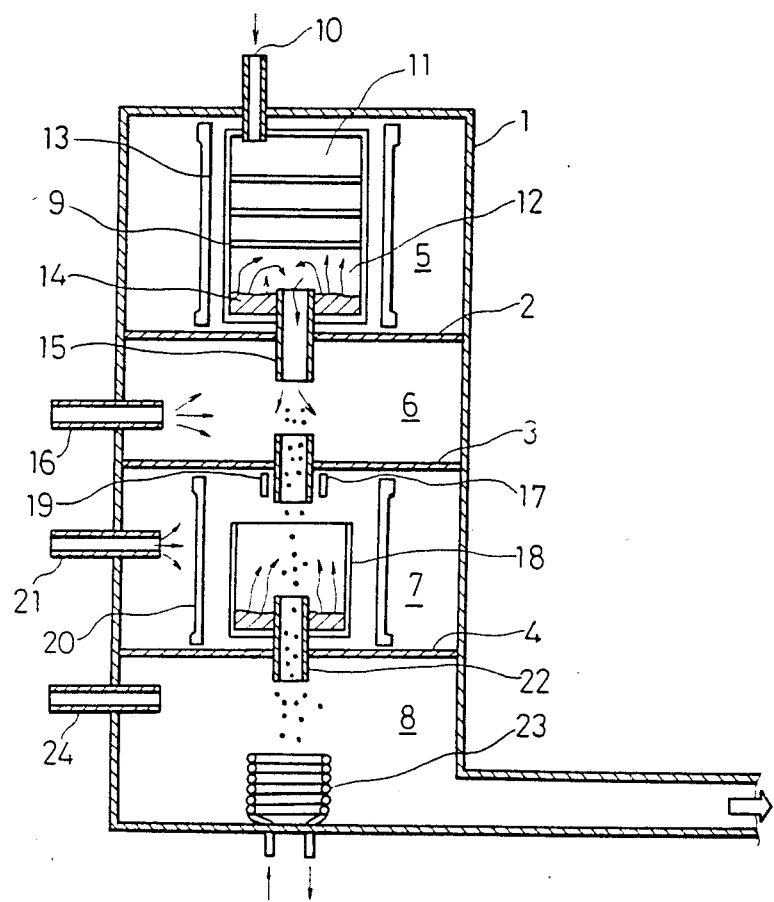
FIG. 4 is a schematic structural view showing an apparatus of making a metallic compound fine powder used in Examples 1–3 of the present invention.

FIG. 4 shows a schematic structural view of an apparatus for making a ceramic-coated metallic compound fine powder used in Example 1 according to the invention.

In the figure, the reference numeral 1 indicates a furnace shell which is substantially formed as a closed container and the shell 1 is vertically divided by partition walls 2, 3 and 4 into four chambers 5, 6, 7 and 8. In the first chamber 5 is provided a first crucible 9. The first crucible 9 has a gas-preheating chamber 11 having a carrier gas introduction port 10 and a mixing chamber 12 communicating with the gas-preheating chamber 11. Around the first crucible 9 is provided a first heater 13 for keeping the gas-preheating chamber 11 and the mixing chamber 12 at a predetermined temperature, $T_1$. A metal which is charged into the mixing chamber 12 is molten by means of the first heater 13 to provide a molten metal 14, which will be vaporized as metallic vapor.

The first crucible 9 has a bottom wall, through which a first nozzle or tube 15 having a diameter of 7 mm. The first tube 15 is passed through the partition wall 2 and communicates with the mixing chamber 12 and the second chamber 6. The second chamber 6 has a reaction gas introduction tube 16, which intersects at right angles with the first tube 15, for introducing another element or a gas containing the element constituting an intended metallic compound. The introduction tube 16 is connected to a bomb not shown.

The second chamber 6 and the third chamber 7 communicate with each other through a second fine tube 17. Beneath the second fine tube 17 is provided a second crucible 18, in which a metal or metallic compound is placed. Around the second fine tube 17 and the second crucible 18 are provided a second heater 19 and a third heater 20, which are used to heat the second fine tube 17 and the second crucible 18, respectively. The third chamber 7 has an inert gas introduction tube 21 through which an inert gas such as nitrogen, argon or the like is introduced and which is connected to a bomb not shown. The bottom of the second crucible 18 and the fourth chamber 8 communicate with each other through a fine tube 22.

A collector pipe 23 for collecting a synthesized fine powder of a metallic compound with a ceramic coating is provided at the bottom of the fourth chamber 8 and below the third fine tube 22. The collector tube 23 is made of a copper pipe, through which cooling water is passed.

Part of the fourth chamber 8 is connected to an evacuation means such as a vacuum pump not shown. The vacuum pump is operated to evacuate the second chamber 6 and the mixing chamber 12 to predetermined pressures, $P_2$ and $P_1$, respectively. It will be noted that the third chamber 7 is set, using an inert gas, to a pressure lower by 3 to 5 Torr. than the second chamber 6.

The apparatus of the type as described above is used to make silicon nitride fine powder coated with an yttrium oxide film in the following manner.

EXAMPLE 1

Metallic silicon is charged into the mixing chamber 12 and the furnace shell 1 is reduced, by means of a vacuum pump, to an extent of $10^{-2}$ Torr. ($1.3 \times 10^{-5}$ atmospheres). Thereafter, nitrogen gas is charged from the carrier gas introduction port 10 through the gas-preheating chamber 11 into the mixing chamber 12. At the same time, the first crucible 9 in the furnace shell 1 is rapidly heated by the use of the first heater 13 until the temperature, $T_1$, in the mixing chamber 12 reaches about 2200° C. As a result, the metallic silicon melts to provide molten silicon 14. The introduction rate of nitrogen gas is controlled to be 6 liters/minute so that the pressure, $P_1$, within the mixing chamber 8 is adjusted to about 15 Torr. ($2 \times 10^{-2}$ atmospheres).

On the other hand, ammonia gas ($NH_3$) of a normal temperature is charged, at a rate of 12 liters/minute, into the second chamber 6 through the tube 16 in the direction intersecting at right angles with the first fine tube 15, so that the inner pressure in the lower chamber 4 was about 8 Torr. ($1.1 \times 10^{-2}$ atmospheres).

Yttrium chloride powder is charged into the second crucible and is heated to 800° to 1100° C. by means of the third heater 20 and vaporized. Argon gas heated to about 1000° C. is introduced from the inert gas introduction tube 21 so that the third chamber 7 is lower by 5 Torr. than the chamber 6.

To the fourth chamber 8 is fed oxygen from the oxygen introduction tube 24.

As a result, the gaseous mixture of the silicon vapor and the nitrogen gas formed in the mixing chamber 12 is passed into the second chamber 6 through the first fine tube 15 by virtue of the pressure difference between the mixing chamber 12 and the second chamber 6. The passed gaseous mixture comprises about 1 g/minute of the silicon vapor and cooled down to 1800° C. immediately after the passage. This gaseous mixture is further rapidly cooled by contact with ammonia gas and converted into silicon nitride in the form of fine powder, followed by continuing further cooling with the ammonia gas.

The silicon nitride fine powder is blown out into the third chamber 7 through the second fine tube 17 while heating with the second heater 19. In the third chamber 7, yttrium vapor produced by decomposition is deposited on the silicon nitride fine powder. The silicon nitride fine powder on which yttrium is deposited is passed through the third fine tube 22 into the fourth chamber 8 in which it is deposited on the collector tube 23 while oxidizing with oxygen and stabilizing.

After completion of the reaction, the synthesized powder deposited on the collector tube 3 is sampled to check the content thereof. As a result, it is found that 70% of the powder consists of yttrium oxide film-deposited silicon nitride. The rate of synthesis or yield is 70%. The resulting silicon nitride fine powder has an average particle size of 100 angstrom and a uniform yttrium oxide film thereof.

EXAMPLE 2

The same apparatus as used in Example 1 is used to make an aluminium oxide film-deposited silicon nitride fine powder. In this example, the fine powder is made under the same conditions as in Example 1 except that aluminium chloride is used instead of yttrium chloride as the other metallic compound.

The resulting silicon nitride fine powder has an average particle size of 100 angstrom with a rate of synthesis being 70% and it also has a uniform deposition of aluminium oxide on the surface thereof.

EXAMPLE 3

The same apparatus as used in Example 1 is used to make a magnesium oxide film-deposited silicon nitride fine powder. In this example, the magnesium oxide film-deposited silicon nitride fine powder is made under the same conditions as in Example 1, except that metallic magnesium is used as other metal instead of yttrium chloride.

As a result, the magnesium oxide film-deposited silicon nitride fine powder has an average particle size of 100 angstrom with a rate of synthesis being 68% and it has a uniform deposition of magnesium oxide on the surface thereof.

In the above examples, specific examples relating to the production of ceramic coated silicon nitride fine powder according to the invention are described, but the present invention should not be construed as limiting to these examples. For instance, the method of the invention is also applicable to deposition of a ceramic film on fine powders of various metallic compounds such as silicon carbide, aluminium nitride, titanium carbide and the like.

What is claimed is:

1. A method for preparing a finely powdered product of a metallic compound coated with a ceramic, comprising the steps of:
   (a) providing a gaseous mixture of at least one metal vapor, which constitutes one element of said metallic compound, in a carrier gas;
   (b) passing said gaseous mixture through a nozzle, thereby rapidly cooling said gaseous mixture by adiabatic expansion of the mixture, into an atmosphere comprising a gas containing the other element of said metallic compound by utilizing the pressure difference between the gaseous mixture and said atmosphere, said atmosphere being heated to a temperature not greater than 0.8 times as low as the melting point of the metal of said metal vapor so that both of said elements react with each other as the rapid cooling of the mixed gases occurs, thereby forming a vapor containing said metallic compound in a fine powder form;
   (c) passing the vapor of finely divided metallic compound through a second vapor of a metal or metal compound of said ceramic, thereby resulting in deposition of the metal or metal compound of the ceramic on the finely powdered metallic compound; and
   (d) oxidizing the deposited second metal or metal compound to a ceramic coating.

2. The method of claim 1, wherein said gaseous mixture is passed into said atmosphere at a speed of 50 to 2000 m/second.

3. The method of claim 1, wherein said metal or metal compound of the ceramic is a sintering aid.

4. The method of claim 1, wherein said carrier gas is an inert gas.

5. A method of preparing a finely powdered product of a metallic compound coated with a ceramic, comprising the steps of:
   (a) providing a gaseous mixture of at least metal vapor, which constitutes one element of said metallic compound, in a carrier gas constituted of the other element of said metallic compound under conditions which provide for the rapid cooling of said gaseous mixture by adiabatic expansion, thereby allowing said elements to react with each other;
   (b) obtaining said metallic compound in the vapor state in finely powdered form as a result of said reaction;
   (c) passing the vapor containing said finely powdered metallic compound through a second vapor of a metal or metal compound of said ceramic, thereby resulting in deposition of the metal or metal compound of the ceramic on the finely powdered metallic compound; and (d) oxidizing the deposited second metal or metal compound to a ceramic coating.

6. The method of claim 5, wherein said metal vapor of said gaseous mixture is silicon vapor, the remaining element of said metallic compound is nitrogen, and said gaseous mixture is heated to a temperature not less than 2000° C. with the pressure of said gaseous mixture being not more than $10^{-1}$ atmospheres.

7. The method of claim 5, wherein said metal vapor is passed into said carrier gas at a speed of 50 to 2000 m/second.

8. The method of claim 5, wherein said carrier gas constitutes a gaseous compound containing the element which reacts with said metal vapor.

9. The method of claim 5, wherein said at least one metal vapor is silicon vapor, the carrier gas containing the element which reacts with said metal vapor being ammonia gas, said metallic compound product being silicon nitride, and said ceramic coating being yttrium oxide.

10. The method of claim 5, wherein said carrier gas is an inert gas.

* * * * *